United States Patent
Shrivastava et al.

(10) Patent No.: US 10,840,348 B2
(45) Date of Patent: Nov. 17, 2020

(54) ENHANCEMENT MODE HIGH ELECTRON MOBILITY TRANSISTOR (HEMT)

(71) Applicant: INDIAN INSTITUTE OF SCIENCE, Bangalore (IN)

(72) Inventors: Mayank Shrivastava, Bangalore (IN); Sayak Dutta Gupta, Bangalore (IN); Ankit Soni, Bangalore (IN); Srinivasan Raghavan, Bangalore (IN); Navakanta Bhat, Bangalore (IN)

(73) Assignee: Indian Institute of Science, Karnataka (IN)

( * ) Notice: Subject to any disclaimer, the term of this patent is extended or adjusted under 35 U.S.C. 154(b) by 0 days.

(21) Appl. No.: 16/114,650

(22) Filed: Aug. 28, 2018

(65) Prior Publication Data
US 2019/0067440 A1     Feb. 28, 2019

(30) Foreign Application Priority Data
Aug. 29, 2017   (IN) .............................. 201741030570

(51) Int. Cl.
*H01L 29/49*       (2006.01)
*H01L 29/778*      (2006.01)
(Continued)

(52) U.S. Cl.
CPC ...... *H01L 29/4983* (2013.01); *H01L 21/0228* (2013.01); *H01L 21/02178* (2013.01);
(Continued)

(58) Field of Classification Search
None
See application file for complete search history.

(56) References Cited

U.S. PATENT DOCUMENTS

| | | | |
|---|---|---|---|
| 7,379,322 B2* | 5/2008 | Min | C23C 16/40 365/145 |
| 7,588,988 B2* | 9/2009 | Ahn | C23C 16/0281 438/287 |
| 8,154,066 B2* | 4/2012 | Ahn | C23C 16/0281 257/310 |
| 8,541,276 B2* | 9/2013 | Ahn | C23C 16/0281 438/261 |
| 9,443,938 B2* | 9/2016 | Mishra | H01L 29/15 |
| 9,859,413 B2* | 1/2018 | Okita | H01L 29/66462 |

(Continued)

*Primary Examiner* — Lex H Malsawma
(74) *Attorney, Agent, or Firm* — Greer Burns & Crain Ltd.

(57) ABSTRACT

The present disclosure provides an improved enhancement mode field effect transistor (FET) having an oxide ($Al_xTi_{1-x}O$) emulating p-type gate. The present disclosure provides a novel enhancement mode High Electron Mobility Transistor (HEMT) structure with $Al_xTi_{1-x}O$ Gate Oxide Engineering as Replacement of p-GaN Gate. In an aspect, the present disclosure provides a hybrid gate stack that combines p-GaN technology with the proposed oxide for e-mode operation. The HEMT structure with $Al_xTi_{1-x}O$ Gate oxide provides a threshold voltage tuning from negative to positive by changing p-doping composition. Using a developed p-type oxide, e-mode device shows ON current ~400 mA/mm, sub-threshold slope of 73 mV/dec, $R_{on}$=8.9 Ωmm, interface trap density $<10^{10}$ $mm^{-2}eV^{-1}$ and gate leakage below 200 nA/mm at the OFF-state breakdown.

12 Claims, 20 Drawing Sheets

(51) Int. Cl.
  *H01L 21/02* (2006.01)
  *H01L 29/51* (2006.01)
  *H01L 29/66* (2006.01)
  H01L 29/423 (2006.01)
  H01L 29/10 (2006.01)
  H01L 29/20 (2006.01)
(52) U.S. Cl.
  CPC .. *H01L 21/02186* (2013.01); *H01L 21/02194* (2013.01); *H01L 29/517* (2013.01); *H01L 29/66462* (2013.01); *H01L 29/7786* (2013.01); H01L 29/1066 (2013.01); H01L 29/2003 (2013.01); H01L 29/4236 (2013.01)

(56) References Cited

U.S. PATENT DOCUMENTS

| | | | | |
|---|---|---|---|---|
| 2003/0045082 | A1* | 3/2003 | Eldridge | H01L 27/115 438/593 |
| 2006/0043504 | A1* | 3/2006 | Ahn | C23C 16/0281 257/410 |
| 2007/0090441 | A1* | 4/2007 | Ahn | C23C 16/0281 257/310 |
| 2009/0146185 | A1* | 6/2009 | Suh | H01L 29/2003 257/194 |
| 2010/0155720 | A1* | 6/2010 | Kaneko | H01L 29/2003 257/43 |
| 2012/0112202 | A1* | 5/2012 | Hwang | H01L 29/66462 257/76 |
| 2012/0196448 | A1* | 8/2012 | Ahn | C23C 16/0281 438/763 |
| 2016/0308023 | A1* | 10/2016 | Hsu | H01L 29/2003 |

\* cited by examiner

1. ○ S/D Ohmic Contact
   a. 10 nm AlGaN barrier recess
   b. Ti/Al/Ni/Au deposition
   c. 820°C/30s $N_2$ anneal 2. ○ MESA Isolation
   200 nm buffer etch
   $Cl_2/BCl_3$ chemistry 3. ○ Gate Recess Etching
   (Optional)
   $O_2/BCl_3$ ALE
   ~1 nm/cycle etch rate
   <1 nm surface roughness 4. ○ Pre-Oxide Deposition
   Cleaning
   Acetone, IPA dip
   dil. HCl and HF dip 5. ○ Oxide deposition
   $TiO_2$/AlTiO (ALD)
   Post oxide deposition anneal (PDA)

6. ○ Gate & Field Plate Metal
   Ni/Au deposition
   Post metallization anneal (PMA)

7. ○ S/D Pad Opening

FIG. 6

ENHANCEMENT MODE HIGH ELECTRON MOBILITY TRANSISTOR (HEMT)

TECHNICAL FIELD

The present disclosure relates generally to the field of field effect transistors (FET). In particular, the present disclosure relates to gate engineering in High Electron Mobility Transistors (HEMT) for improved enhancement mode performance.

BACKGROUND

Background description includes information that may be useful in understanding the present invention. It is not an admission that any of the information provided herein is prior art or relevant to the presently claimed invention, or that any publication specifically or implicitly referenced is prior art.

A high-electron-mobility transistor (HEMT), also known as heterostructure FET (HFET) or modulation-doped FET (MODFET), is a field-effect transistor (FET) that incorporates a junction between two materials that have different band gaps (i.e. a heterojunction) as the channel instead of a doped region (as is generally the case for MOSFET). A commonly used material combination is Gallium arsenide (GaAs) with Aluminium gallium arsenide (AlGaAs), though there is wide variation in such combinations depending on the application of the device. Devices incorporating more indium generally show better high-frequency performance, while in recent years, gallium nitride HEMTs have attracted attention due to their high-power performance.

Normally OFF Aluminium gallium nitride (AlGaN)/gallium nitride (GaN) HEMTs have emerged as efficient switching devices in the growing power semiconductor market. The major bottleneck is to have an effective method for depleting the channel so that it does not degrade device characteristics. There have been several approaches proposed over time for turning off the HEMT channel, namely recessed gate, F$^-$ ion implanted gate and p-GaN gate structures, but such approaches have repercussions that are imperative to device performance. For example, complete etching of AlGaN barrier leads to Two-Dimensional Electron Gas (2DEG) depletion, but the resultant device suffers from degraded on-state performance such as low channel mobility, high ON-state resistance and poor reliability. Fluorine ion implantation under gate has been another widely-adopted technique but F$^-$-ion stability under high stress or temperature condition is still questionable. Using a thick p-GaN cap to deplete 2DEG can effectively weaken the gate drive and device performance. All these methods/approaches are sufficient for turning-off the device, but still are placed far away when accounted for the variability, consistency and long-term reliability.

Also, Enhancement mode (E-mode), or normally-OFF devices, based on Gallium Nitride (GaN) technology are interesting for a variety of applications such as in integration of control circuitry and for added safety of a normally-OFF device in power switching applications. As already known in the art, enhancement mode operation is commonly achieved using an AlGaN/GaN buffer structure by etching away some of the AlGaN under the gate region until all the charge is depleted, or by exposing the AlGaN under the gate with fluoride-based plasma until negatively charged fixed fluorine ions screen all the charge in the channel. However, these devices suffer from threshold voltage non-uniformity and repeatability due to the processes requiring gate recess etch or plasma treatment. Also, these devices have a low Schottky gate turn-on voltage (of at most 2 V) due to low Schottky barriers. If a threshold voltage of 1V is required, these devices are left with a maximum modulation of 1V. Because high-power switching applications require a threshold voltage of over 1V for gate signal noise immunity, increasing gate turn-on voltage is crucial. Further, utilization of p-GaN barrier below the gate is also known in the prior-art, wherein such utilization depletes channel and increases gate turn-on voltage to 3V, rendering it attractive for high-power applications. However, such field effect devices suffer from high ON-resistance.

The exploration for a novel technique that mitigates above-mentioned limitations and enhances performance in normally-OFF condition is still continued. There is therefore a need to provide a new, improved, efficient, and technically advanced HEMT device that can provide a replacement of p-GaN gate and can help mitigate the above-mentioned limitations, along with enhancing performance in normally-OFF condition. Further, there is also a need to provide an HEMT device that demonstrates threshold voltage tuning from negative to positive by changing p-doping composition, and/or high performance with ON current, and/or low sub-threshold slope, and/or low interface trap density, and/or low gate leakage at the OFF-state breakdown.

In some embodiments, numerical parameters set forth in the written description and attached claims are approximations that can vary depending upon the desired properties sought to be obtained by a particular embodiment. In some embodiments, the numerical parameters should be construed in light of the number of reported significant digits and by applying ordinary rounding techniques. Notwithstanding that the numerical ranges and parameters setting forth the broad scope of some embodiments of the invention are approximations, the numerical values set forth in the specific examples are reported as precisely as practicable. The numerical values presented in some embodiments of the invention may contain certain errors necessarily resulting from the standard deviation found in their respective testing measurements.

As used in the description herein and throughout the claims that follow, the meaning of "a," "an," and "the" includes plural reference unless the context clearly dictates otherwise. Also, as used in the description herein, the meaning of "in" includes "in" and "on" unless the context clearly dictates otherwise.

The recitation of ranges of values herein is merely intended to serve as a shorthand method of referring individually to each separate value falling within the range. Unless otherwise indicated herein, each individual value is incorporated into the specification as if it were individually recited herein. All methods described herein can be performed in any suitable order unless otherwise indicated herein or otherwise clearly contradicted by context. The use of any and all examples, or exemplary language (e.g. "such as") provided with respect to certain embodiments herein is intended merely to better illuminate the invention and does not pose a limitation on the scope of the invention otherwise claimed. No language in the specification should be construed as indicating any non-claimed element essential to the practice of the invention.

Groupings of alternative elements or embodiments of the invention disclosed herein are not to be construed as limitations. Each group member can be referred to and claimed individually or in any combination with other members of the group or other elements found herein. One or more members of a group can be included in, or deleted from, a group for reasons of convenience and/or patentability. When any such inclusion or deletion occurs, the specification is herein deemed to contain the group as modified thus fulfilling the written description of all groups used in the appended claims.

OBJECTS

A general object of the present disclosure is to provide a field effect transistor (FET) operating in enhancement mode (e-mode).

Another object of the present disclosure is to provide an FET with a tunable threshold voltage.

Another object of the present disclosure is to provide an FET with a gate oxide which emulates p-type behaviour.

SUMMARY

The present disclosure relates generally to the field of field effect transistors (FET). In particular, the present disclosure relates to gate engineering in normally OFF High Electron Mobility Transistors (HEMT) for improved enhancement mode performance.

In an aspect, the present disclosure provides a transistor comprising: a source; a drain; and a hybrid gate stack that demonstrates p-type behaviour. In an embodiment, the hybrid gate stack comprises $Al_xTi_{1-x}O$. In another embodiment, the transistor is a High Electron Mobility Transistor (HEMT).

In another aspect, the $Al_xTi_{1-x}O$ is formed by Al doping of $TiO_2$ so as to impart said p-type behaviour to said oxide.

In another aspect, the $Al_xTi_{1-x}O$ demonstrates said p-type behaviour by positioning conduction band above Fermi level in the channel region, that is used as a control parameter to deplete 2DEG in channel. In another aspect, Al content in said oxide is used as controlling parameter for threshold voltage.

In another aspect, the hybrid gate stack further comprises a p-type GaN cap.

In another aspect, the hybrid gate stack is supported by an AlGaN/GaN stack, wherein the hybrid gate stack is brought closer to channel by partial removal of AlGaN barrier under said hybrid gate stack, followed by deposition of said $Al_xT_{1-x}O$.

In another aspect, the transistor is operated in enhancement mode (e-mode).

In another aspect, the present disclosure provides a transistor comprising: a source; a drain; and a hybrid gate stack that comprises one or more p-type metal oxides.

In another aspect, the hybrid gate stack is supported by an AlGaN/GaN stack, wherein the hybrid gate stack is brought closer to channel by partial removal of AlGaN barrier under said hybrid gate stack, followed by deposition of said p-type metal oxide.

In another aspect, the hybrid gate stack further comprises a p-type GaN cap.

In another aspect, the hybrid gate stack further comprises an oxide material. In another aspect, the present disclosure provides a method for making an $Al_xTi_{1-x}O$ based oxide that demonstrates p-type behaviour, said method comprising the steps of using atomic layer deposition (ALD) to enable deposition of $Al_2O_3$ and $TiO_2$ across a plurality of cycles to introduce Al atoms in $TiO_2$.

In another aspect, the method further comprises the step of depositing $Al_2O_3$ in ALD chamber using cycles involving introduction of trimethylaluminium (TMA) and $H_2O$ precursors.

In another aspect, the method further comprises the step of depositing $TiO_2$ in said ALD chamber using cycles involving introduction of Titanium tetraisopropoxide (TTIP) and $H_2O$ precursors.

Various objects, features, aspects and advantages of the inventive subject matter will become more apparent from the following detailed description of preferred embodiments, along with the accompanying drawing figures in which like numerals represent like components.

BRIEF DESCRIPTION OF THE DRAWINGS

The accompanying drawings are included to provide a further understanding of the present disclosure and are incorporated in and constitute a part of this specification. The drawings illustrate exemplary embodiments of the present disclosure and, together with the description, serve to explain the principles of the present disclosure.

FIG. 6 illustrates fabrication procedure adopted for demonstrating AlGaN/GaN HEMTs designed for e-mode operation with the proposed AlTiO based gate stack.

DETAILED DESCRIPTION

Figure 1A:
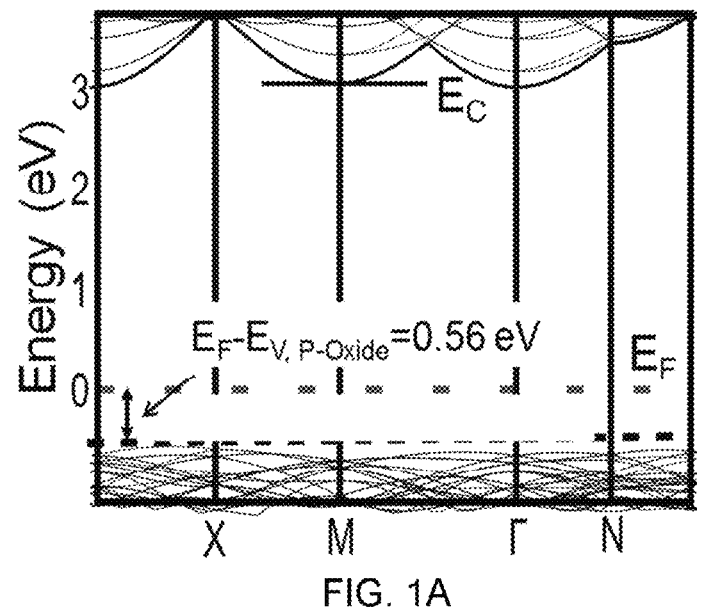
FIG. 1A illustrates band structure of anatase $TiO_2$ extracted using DFT.

The following is a detailed description of embodiments of the disclosure depicted in the accompanying drawings. The embodiments are in such detail as to clearly communicate the disclosure. However, the amount of detail offered is not intended to limit the anticipated variations of embodiments; on the contrary, the intention is to cover all modifications, equivalents, and alternatives falling within the spirit and scope of the present disclosure as defined by the appended claims.

Various terms as used herein are shown below. To the extent a term used in a claim is not defined below, it should be given the broadest definition persons in the pertinent art have given that term as reflected in printed publications and issued patents at the time of filing.

The present disclosure relates generally to the field of field effect transistors (FET). In particular, the present disclosure relates to gate engineering in High Electron Mobility Transistors (HEMT) for improved enhancement mode performance.

It is an object of the present disclosure to solve technical problems as recited above in the background section. Accordingly, in an embodiment, in order to overcome limitations in prior art described above, and to overcome other limitations that will become apparent upon reading and understanding the present disclosure, the present disclosure provides a novel enhancement mode High Electron Mobility Transistor (HEMT) structure with $Al_xTi_{1-x}O$ layer (gate oxide) as replacement of p-GaN Gate.

Under the gate, this transistor has an $Al_xTi_{1-x}O$ epilayer structure, which structure in HEMT enables achievement of threshold voltage tuning from negative to positive by changing p-doping composition. Further, using a proposed p-type oxide ($Al_xTi_{1-x}O$ epilayer structure in HEMT), a record high performance 600V class of e-mode HEMT device can be achieved with ON current ~400 mA/mm, a sub-threshold slope of 73 mV/dec, $R_{on}$=8.90Ωmm, interface trap density <$10^{10}$ mm$^{-2}$eV$^{-1}$, and gate leakage below 200 nA/mm at the OFF-state breakdown.

In an aspect, under access and contact regions, epilayer is AlGaN/GaN. Due to spontaneous and piezoelectric polarisation, 2DEG is formed at the AlGaN/GaN interface, and due to the high mobility of the electrons in the 2DEG, ON resistance is low. In another aspect, complete recessing of the AlGaN barrier to achieve e-mode HEMT results in electron mobility degradation due to plasma damage, thereby increasing ON resistance. However, a high positive threshold voltage without ON resistance increment is desirable for e-mode operation. In an embodiment, the present disclosure proposes to use a p-type gate oxide to deplete channel to achieve e-mode operation without any adverse effects of plasma damage or losing channel control.

An aspect of the present disclosure provides a method for fabricating a field effect transistor with a hybrid gate stack that combines p-GaN technology with the high-k oxide for e-mode operation. In an aspect, an $Al_xTi_{1-x}O$ high-k gate oxide engineering and HEMT architecture is disclosed that eliminates above discussed issues by providing e-mode operation and records high ON-state performance, while using principle of band engineering. In an aspect, oxide emulating p-type band properties ($Al_xTi_{1-x}O$ high-k gate) can be used as a replacement of p-GaN gate for e-mode HEMT operation.

In an aspect, $Al_2O_3$, widely used as a gate oxide, has a wider band gap ($E_g$, about 6.5 eV), a high crystallisation temperature (about 900° C.) and an offset of about 2-2.25 eV with the conduction band of GaN ($E_c$). It, however, has a low dielectric constant (k, about 9).

In another aspect, $TiO_2$ has the advantage of having a high k (about 60), though it suffers from a lower Eg (about 3.4 eV), a lower crystallisation temperature (about 370° C.) and a low offset with GaN $E_c$ (about 0.3 eV).

In another aspect, a ternary oxide system of Al—Ti—O, by introducing $Al_2O_3$ in $TiO_2$ can have improved band offset with GaN $E_c$, a higher crystallisation temperature, while maintaining a high k.

In an aspect, Al behaves as a negative fixed charge in $TiO_2$, introducing holes in the system and making Al—Ti—O a p-type oxide.

FIG. 1A reveals an Eg of 3.35 eV and a Fermi energy ($E_F$) to oxide valence band energy ($E_{V,\ P\text{-}OXIDE}$) difference $\Delta E_{V,\ P\text{-}OXIDE}$ (=$E_F$–$E_{V,\ P\text{-}OXIDE}$) of about 0.56 eV for $TiO_2$.

Figure 1B:
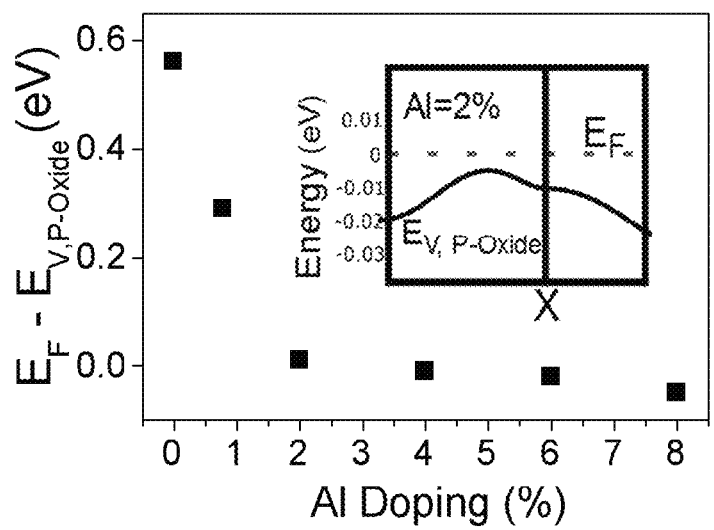
FIG. 1B illustrates shift in Fermi energy level ($E_F$) towards oxide valence band's energy level ($E_{V,P\text{-}Oxide}$) with increasing Al % concentration in $TiO_2$.

FIG. 1B depicts DFT calculations for Al in $TiO_2$ system, showing that introduction of Al in $TiO_2$ systematically lowers $\Delta E_{V,\ P\text{-}OXIDE}$ offering Al as a knob to control p-type behaviour in the proposed ternary oxide system.

It is known that 2DEG present in HEMT structure originates from Fermi level positioned above the conduction band, and therefore tuning the position of Fermi level can enhance or deplete the 2DEG. For conventional high-k oxides such as $Al_2O_3$ and $TiO_2$, Fermi level in the channel region is always above the conduction band, making the device normally-ON. Accordingly, in an embodiment of the present disclosure, an oxide that can emulate p-type nature by positioning valance band above the Fermi level leading to a negative Fermi energy to valance band energy difference ($\Delta E_v$=$E_F$–$E_v$) is used as a control parameter to deplete the 2DEG in channel.

Figure 2A:
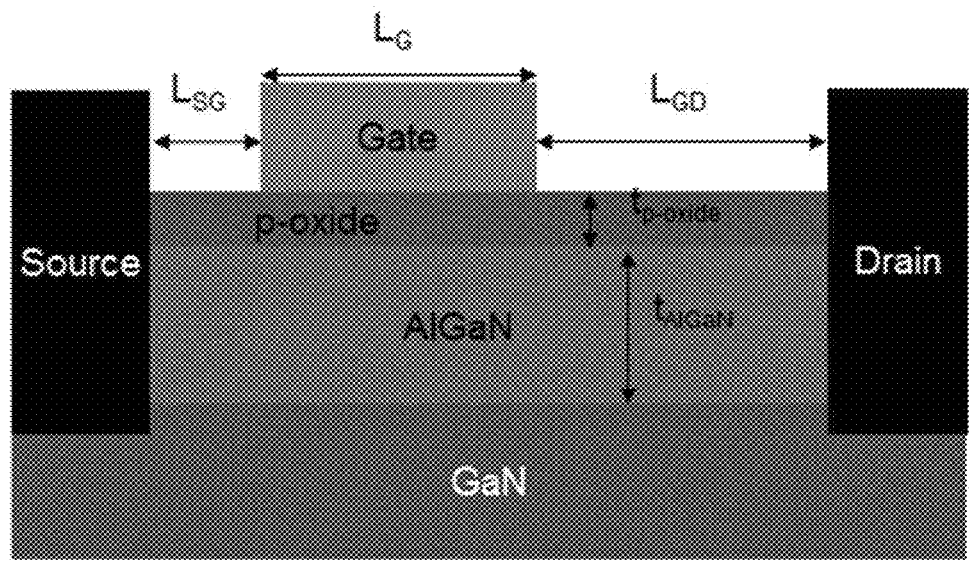
FIG. 2A illustrates a cross-sectional view of HEMT with p-type oxide proposed for e-mode operation, in accordance with an exemplary embodiment of the present disclosure.

In an embodiment, a HEMT device as shown in FIG. 2A with a gate oxide having Fermi energy close to valance band energy is analysed using TCAD simulations. FIG. 2A illustrates a cross sectional view of the HEMT with p-type gate oxide proposed for e-Mode operation, in accordance with an embodiment of the present disclosure.

Figure 2B:
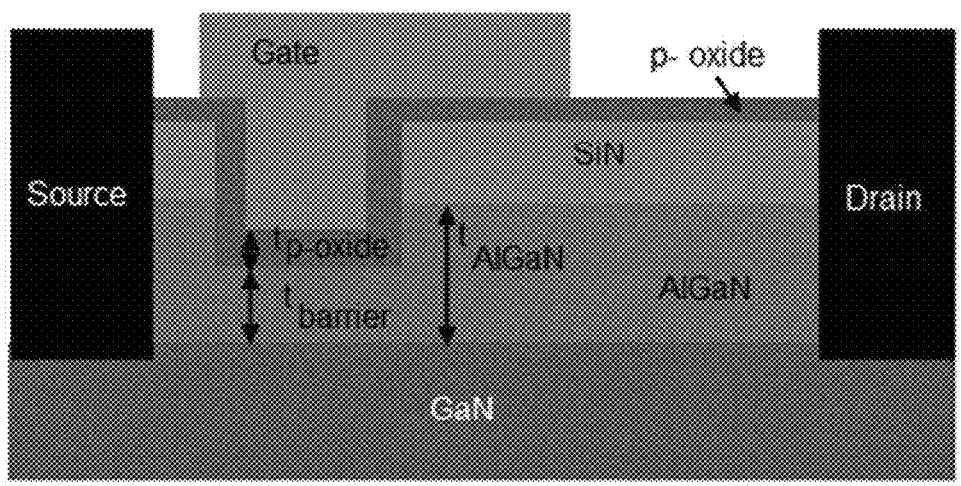
FIG. 2B illustrates a cross-sectional view of the HEMT with p-type metal oxide gate and partially recessed AlGaN barrier under the gate for e-mode operation, in accordance with an embodiment of the present disclosure.
Figure 3A:
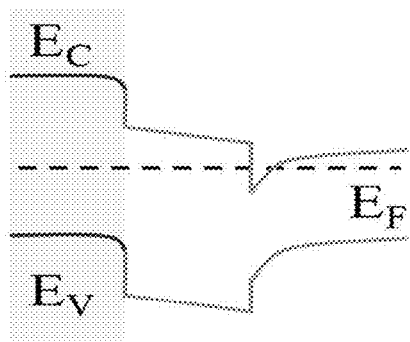
FIGS. 3A and 3B illustrate energy-band diagram of AlGaN/GaN HEMTs with conventional oxides and with the proposed p-type oxide, respectively.
Figure 3B:
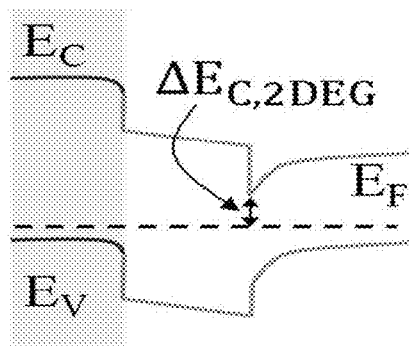

In another embodiment, when a p-type oxide is used inside a HEMT gate stack, as show in in FIG. 2B, $E_F$ in the channel gets shifted away from the conduction band edge ($E_c$). FIGS. 3A and 3B illustrate the shifting of $E_F$ in the channel away from $E_c$ when a conventional oxide and p-type gate oxide is used in an HEMT stack respectively.

Figure 4A:
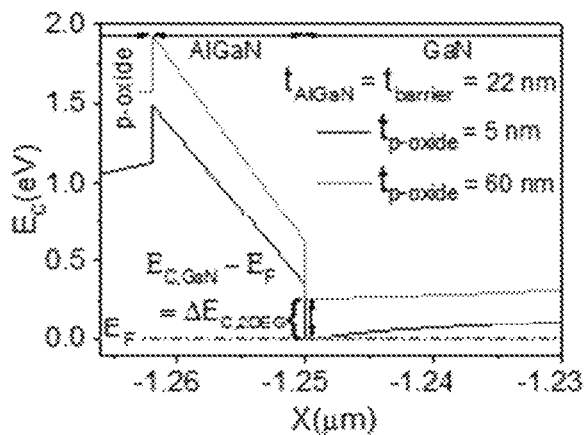
FIGS. 4A-4C illustrate energy band diagrams, shift of Fermi energy level away from conduction band in the channel and resulting shift in threshold voltage respectively, as a function of p-oxide thickness and energy difference between oxide's Fermi and valence bands levels.
Figure 4B:
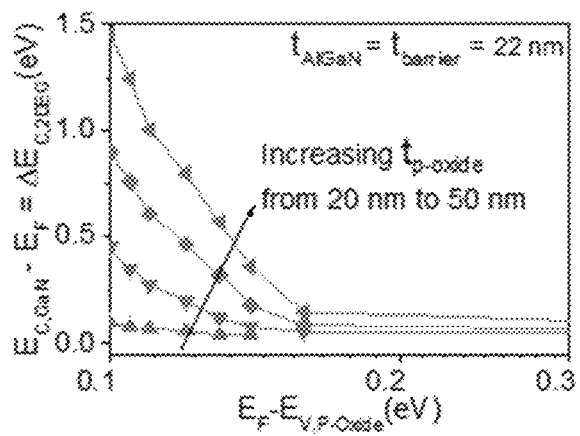

In another embodiment, detailed TCAD simulations along with DFT reveal that the Fermi energy level in the channel shifts below the conduction band energy level ($E_{c,2DEG}$>0) when the oxide's Fermi energy to valance band energy gap ($\Delta E_{V, P\text{-}OXIDE}$) is reduced below 0.2 eV, as illustrated in FIG. 4A. Furthermore, a shift in $\Delta E_{C,2DEG}$ was found to increase with the thickness of p-oxide, as illustrated in FIG. 4B.

Figure 4C:
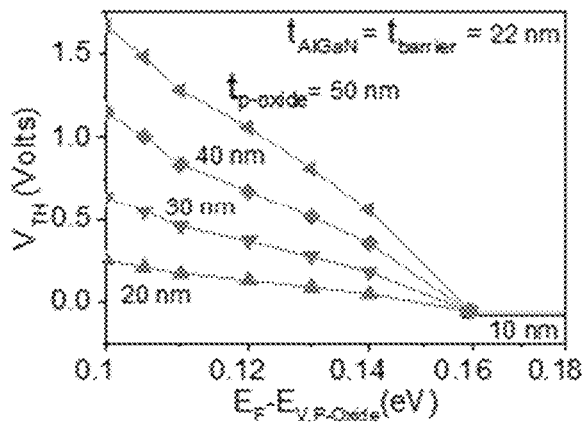

In another embodiment, depletion of electrons in the 2DEG under the p-oxide gate stack for $\Delta E_{C,2DEG}$>0 resulted in a positive shift in $V_{TH}$, which can be controlled by $\Delta E_{V,P\text{-}Oxide}$ (Al %) and p-oxide thickness, as illustrated in FIG. 4C.

In an aspect, the percentage of Al in the AlTiO can be used as a parameter to control $V_{TH}$ of AlGaN/GaN HEMTs. In an exemplary embodiment, it can be observed that an active Al composition of about 1-2% can result in the required threshold voltage shift. However, the Al % for p-type behaviour is found to vary experimentally, and this behaviour can be attributed to the amorphous nature and the growth dependent stoichiometry of the developed ALD oxide.

Figure 5:
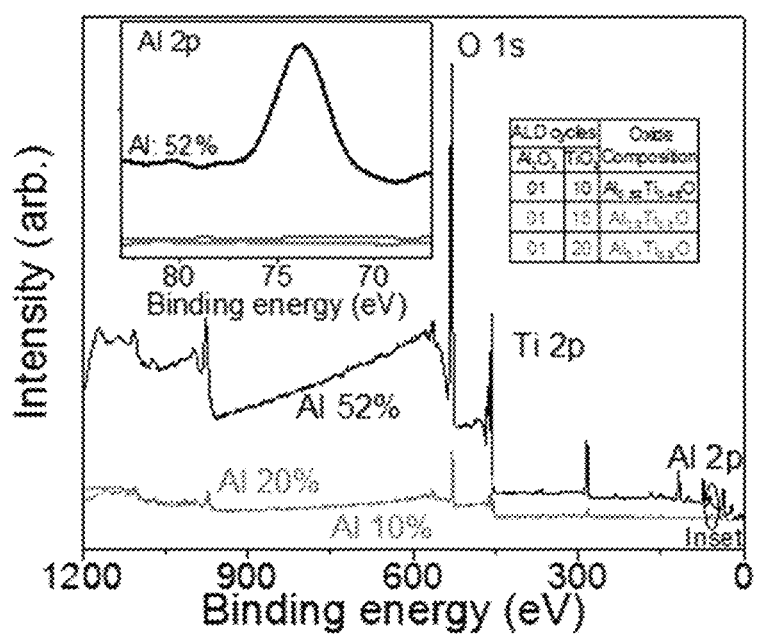
FIG. 5 illustrates XPS spectra of ALD grown AlTiO validating incorporation of Al in $TiO_2$, represented by presence of Al (2p) peak.

In an embodiment, the present disclosure proposes to include Al atoms in $TiO_2$ in order to impart p-type behaviour to oxide, which can be achieved using Atomic Layer Deposition (ALD) using sequential cycles of $Al_2O_3$ and $TiO_2$ deposition. Alternate cycles of trimethylaluminium (TMA) and $H_2O$ precursors were used to deposit $Al_2O_3$ in an ALD chamber at 250° C. In between each of these $Al_2O_3$ cycles, $TiO_2$ can be deposited at 250° C. using Titanium tetraisopropoxide (TTIP) and $H_2O$, with variation in the number of cycles to obtain varied Al composition (10%, 20% and 52%) in the ternary oxide $Al_xTi_{1-x}O$. FIG. 5 illustrates an XPS spectra for various $TiO_2$ and $Al_2O_3$ deposition cycles used to control metal concentrations in the $Al_xTi_{1-x}O$ system (inset Table 1). In an exemplary embodiment, more than a 100 post oxide deposition anneal (PDA) and post gate metallization anneal (PMA) splits were carried out to optimize the ternary oxide system.

In another embodiment, fabrication of HEMT with $Al_xTi_{1-x}O$ dielectric can be performed as elaborated in FIG. 6, on AlGaN/GaN stack, which can be grown using Metal-Organic Chemical Vapour Deposition (MOCVD) technique on Si substrate. 22 nm AlGaN can be grown on GaN buffer separated by a 1 nm AlN spacer and capped by 3 nm GaN. Transistors can be fabricated on the stack starting with 870° C. $N_2$ annealed Ti/Al/Ni/Au for ohmic contacts followed by MESA isolation using $Cl_2$/$BCl_3$ chemistry. Ni/Au Schottky gate contact can finally be established, post blanket dielectric deposition, followed by a low temperature anneal. In a further embodiment, for devices with reduced barrier thickness under the gate, $O_2$—$BCl_3$ atomic layer etching (ALE) was used, followed by post plasma surface treatment.

Figure 7:
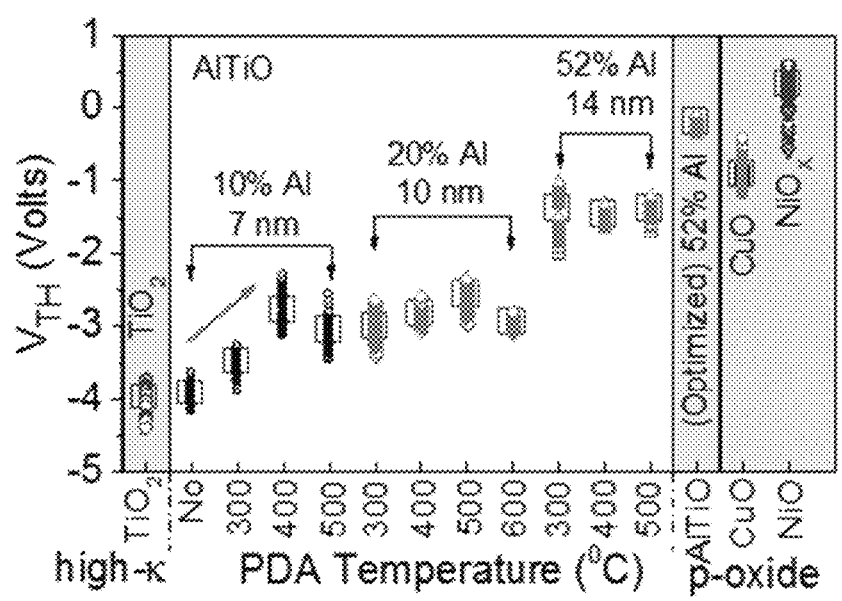
FIG. 7 illustrates threshold voltage as a function of PDA temperatures, Al % and oxide thickness.

In another embodiment, in order to evaluate the HEMT with the proposed AlTiO oxide, other HEMTs with high-k $TiO_2$ and p-oxides like CuO and $NiO_x$ were also realized over the same epi stack. HEMTs with $TiO_2$ resulted in depletion mode (d-mode) operation with a deep-seated $V_{TH}$ of about −4V. FIG. 7 illustrates a permanent shift in HEMT threshold voltage when AlTiO is used in the gate stack. An increase in PDA temperature for an optimized PMA results in a systematic shift in $V_{TH}$, which can be attributed to changes in Al activation % in AlTiO as a function of PDA time and temperature.

Figure 8:
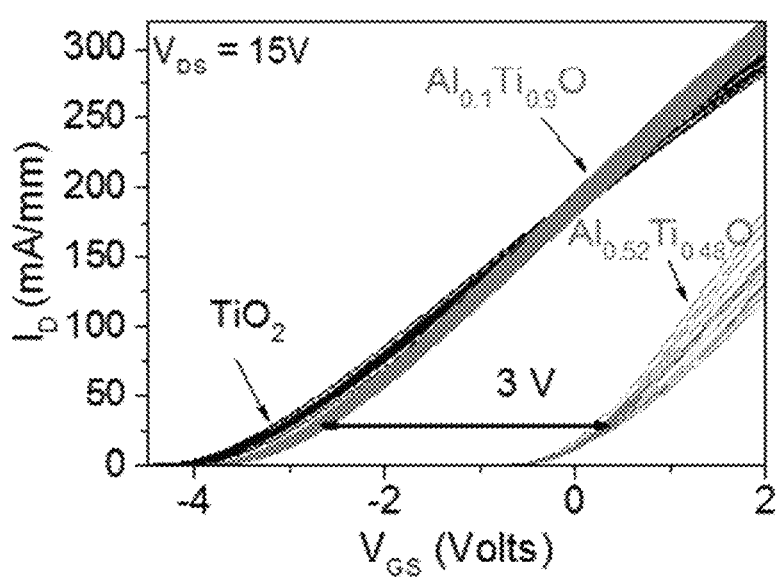
FIG. 8 illustrates transfer characteristics of AlTiO and $TiO_2$ based HEMTs depicting positive shift in $V_{TH}$.

FIG. 8 illustrates a permanent shift in HEMT threshold voltage when AlTiO is used in the gate stack. A shift in $V_{TH}$ of about 0.7V is observed for 10% Al, whereas for AlTiO with about 52% Al, a shift of about 3.8V is seen. This validates the role of Al % as a control knob to tune $V_{TH}$.

Figure 9:
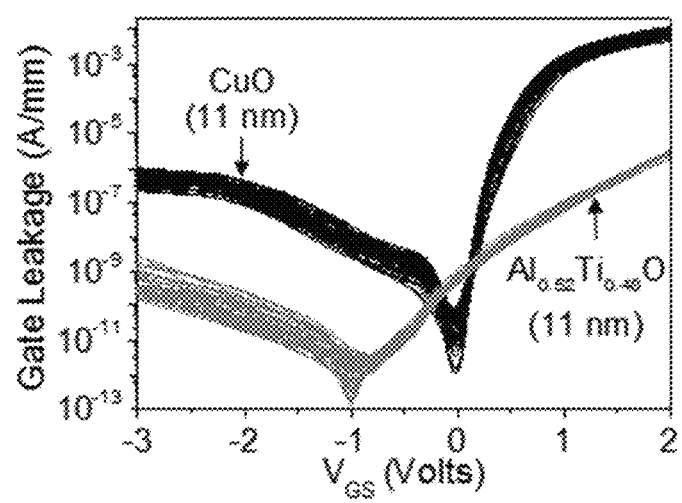
FIG. 9 illustrates gate leakage in AlTiO and CuO based HEMTs.

Referring again to FIG. 9, it can be seen that other p-oxides such as CuO and $NiO_x$ based HEMTs can also offer positive $V_{TH}$ shift. However, their performance can be claimed inferior to that of AlTiO for the following reasons: CuO offers a lower $V_{TH}$ shift when compared to AlTiO; CuO as gate oxide results in a ~4 order (~2 order) higher leakage current under accumulation (inversion) condition when compared to AlTiO for the same thickness, as illustrated in FIG. 10; and $NiO_x$ based HEMTs suffer from very high gate leakage compared to AlTiO and CuO with large variability (data not shown).

Figure 10:
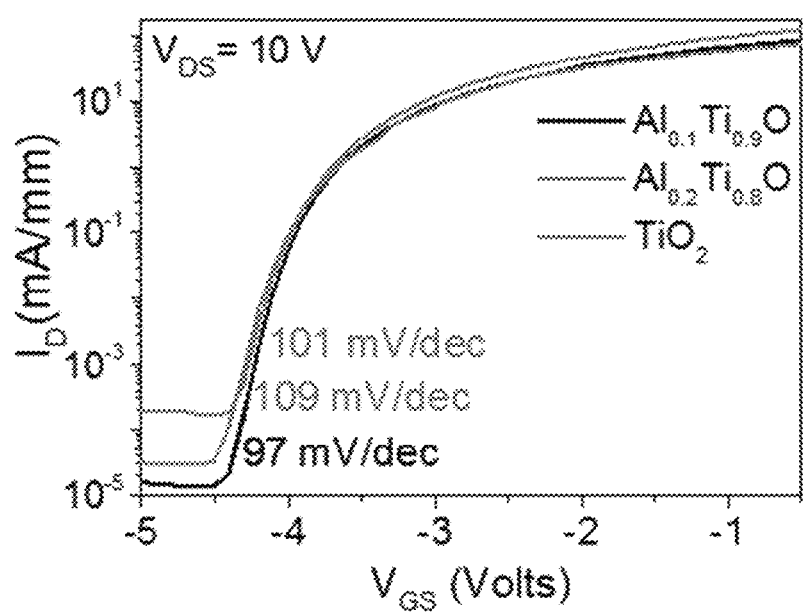
FIG. 10 illustrates transfer characteristics of AlTiO and $TiO_2$ based HEMTs depicting improvement in subthreshold slope.
Figure 11A:
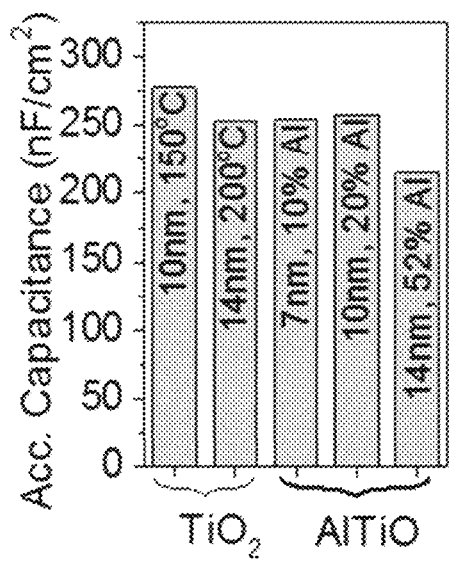
FIGS. 11A and 11B illustrate accumulation capacitance of AlTiO and $TiO_2$ based HEMTs and relative dielectric constant of the oxides extracted from respective accumulation capacitances respectively.
Figure 11B:
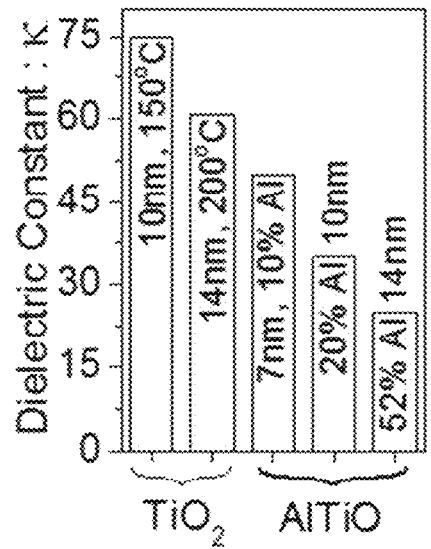

In another embodiment, the advantage of AlTiO system over other p-oxides can be seen further from the improvement in subthreshold slope (SS) of about 10 mV/dec compared to the $TiO_2$ counterpart, as illustrated in FIG. 10. In an exemplary embodiment, FIGS. 11A and 11B illustrate an optimized high-k proposed oxide $Al_{0.52}Ti_{0.48}O$, with a dielectric constant of about 25.

It may be appreciated that the right shift in the $V_{th}$ using $Al_xTi_{1-x}O$ dielectric is critical for designing a normally OFF HEMT device. The $\Delta E_{c,2DEG}$ can be increased further so as to completely deplete the 2DEG. In an exemplary embodiment, one way is to increase oxide thickness to provide additional shift to conduction band until it turns the channel OFF. However, the thick dielectric gate leads to weaker channel control, which can result in a higher source to drain leakage current besides negating the advantages of ultra-thin dielectric.

In another embodiment, the simulations also predict depletion of the 2DEG for higher p-type behaviour in oxide. For HEMTs with oxides such as $Al_2O_3$ or $TiO_2$, to make a normally OFF device, full recessed gate can be employed. It however can have variability issues, wherein damage to channel in this process may have detrimental effects on 2DEG and hence on-state performance.

Figure 12A:
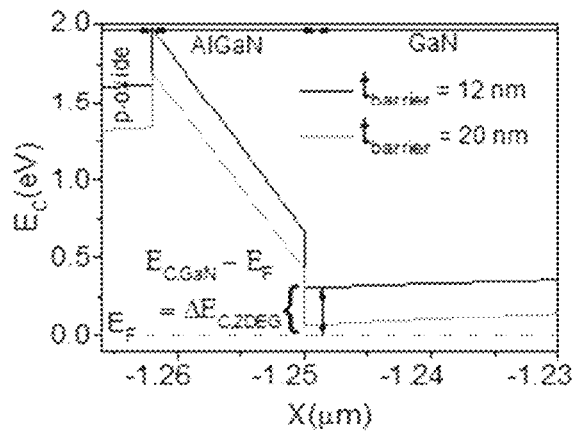
FIGS. 12A-12C illustrate energy band diagrams, shift of Fermi energy level away from conduction band in the channel and resulting shift in threshold voltage respectively, as a function of AlGaN barrier thickness under the gate and energy difference between oxide's Fermi level and valence band.
Figure 12B:
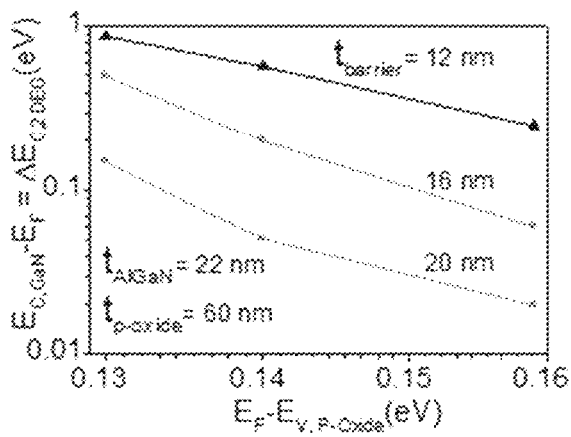
Figure 12C:
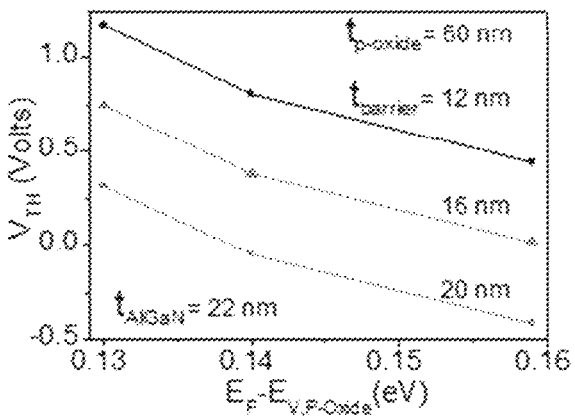

In another embodiment, to mitigate issues as presented above, the effectiveness of the p-oxide gate can be increased by bringing the gate stack closer to the channel by the partial removal of the AlGaN barrier under the gate before depositing the p-oxide, as illustrated in FIGS. 12A-12C. FIGS. 12A-12C illustrate the energy band diagrams, shift of Fermi Energy level away from the conduction band in the channel and the resulting shift in threshold voltage respectively, as a function of AlGaN barrier thickness under the gate for a constant thickness of p-oxide under the gate (about 60 nm).

Figure 13A:
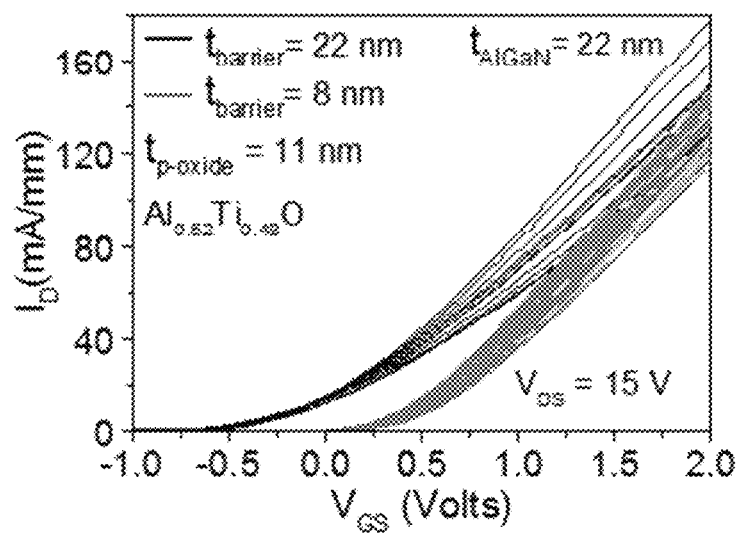
FIG. 13A illustrates $I_{DS}$-$V_{GS}$ characteristics of HEMTs realized using optimized p-oxide with different $t_{barrier}$.
Figure 13B:
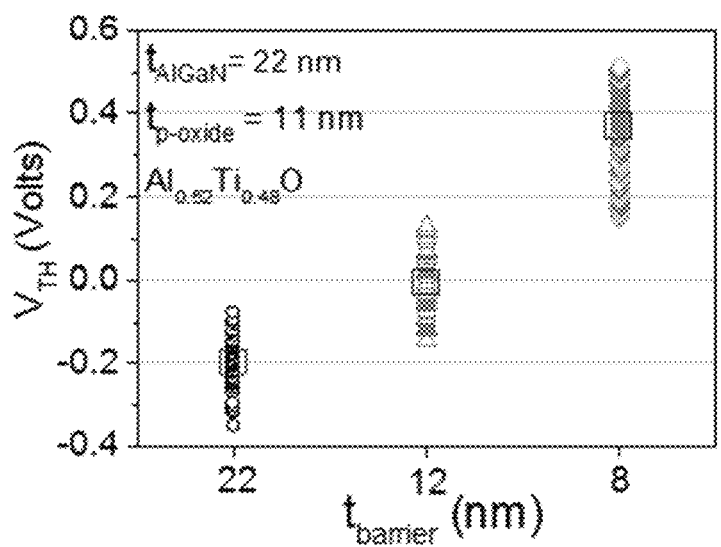
FIG. 13B illustrates linear shift in $V_{TH}$ from negative to positive observed when barrier thickness under the gate is scaled.

In another embodiment, the experimental results, as presented in FIG. 13A illustrates a shift in $V_{TH}$ from −0.2V to 0.5V by reducing the barrier thickness under the gate from 22 nm to 8 nm. FIG. 13B illustrates a linear shift in $V_{TH}$ observed when the barrier thickness under the gate is scaled. It can be appreciated here, that the channel is still 8 nm away from the oxide-semiconductor interface, which helps in mitigating the detrimental effects of plasma damage on 2DEG induced during the ALE of AlGaN. Referring to FIG. 13A again, it can be seen that reducing barrier thickness ($t_{barrier}$=8 nm) under the gate in conjunction with 11 nm p-type AlTiO resulted in e-mode GaN HEMT.

Figure 14:
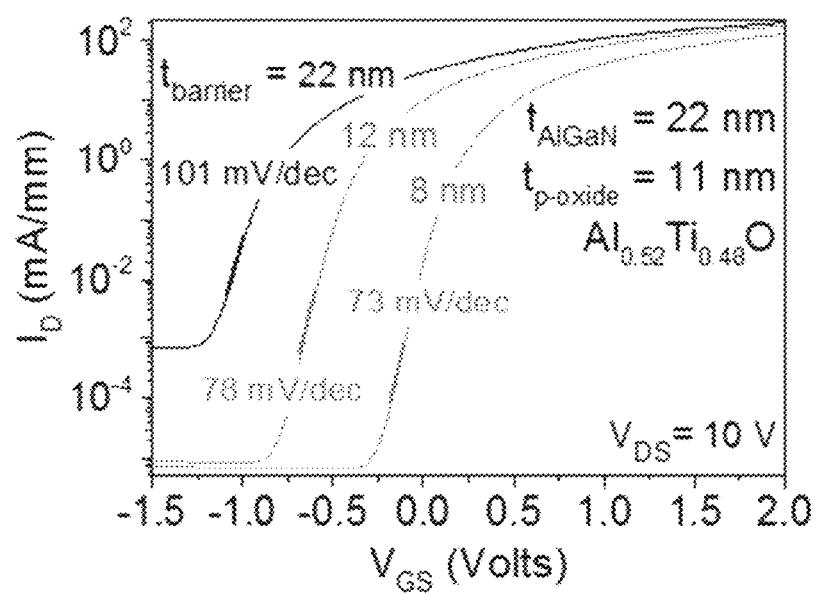
FIG. 14 illustrates improvement in OFF state leakage and subthreshold slope (SS), beside $V_{TH}$ shift, for reduced $t_{barrier}$.

FIG. 14 illustrates, for a HEMT with thinner AlGaN barrier, an improved channel control, which further results in a lower OFF-state leakage and an improved SS. The OFF-state leakage was found to reduce by 100×, whereas SS for e-mode HEMT was found to improve from 101 mV/dec to 73 mV/dec when $t_{barrier}$ was scaled from 22 nm to 8 nm.

Figure 15:
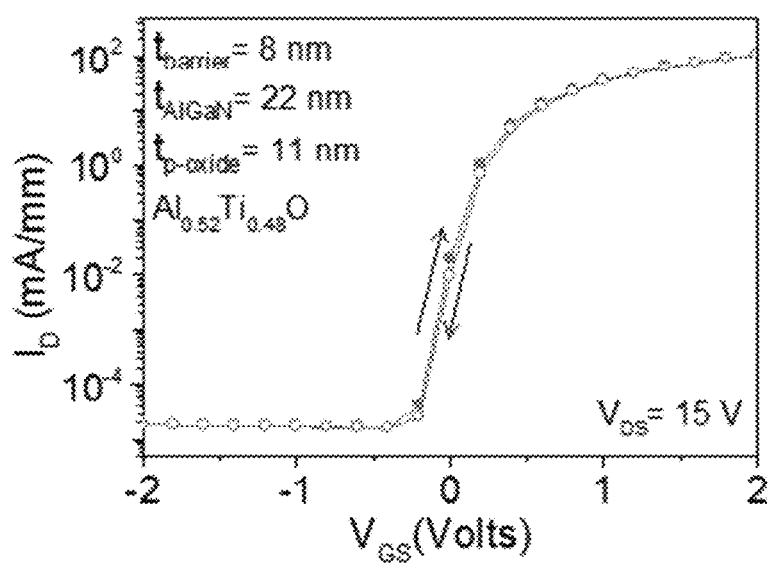
FIG. 15 illustrates dual sweep $I_{DS}$-$V_{GS}$ characteristic of the p-type oxide-based e-mode HEMTs with reduced barrier thickness under gate.

FIG. 15 illustrates a low $V_{TH}$ hysteresis of about 40 mV during $I_{DS}$-$V_{GS}$ dual sweep. The low hysteresis is attributed to the fact that the channel is 8 nm away from the oxide-GaN interface.

Figure 16:
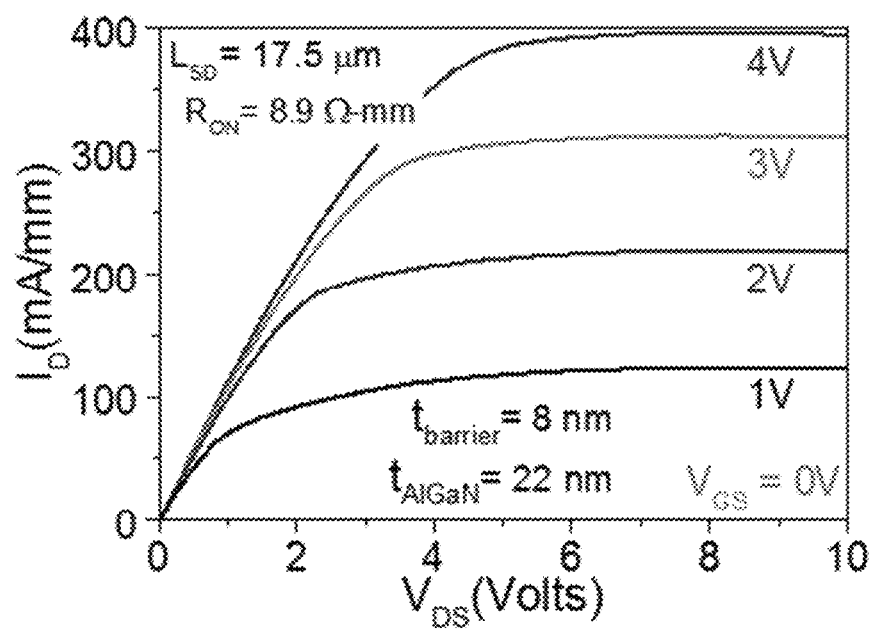
FIG. 16 illustrates $I_{DS}$-$V_{GS}$ characteristics of the p-type based e-mode HEMTs depicting superior ON-current and ON-resistance performance.

FIG. 16 illustrates a superior ON-state performance of the e-mode HEMTs, with a drain current of about 400 mA/mm at $V_{GS}$=4V, $R_{ON}$=8.9 Ω-mm and $I_{ON}/I_{OFF}$=$10^7$.

Figure 17:
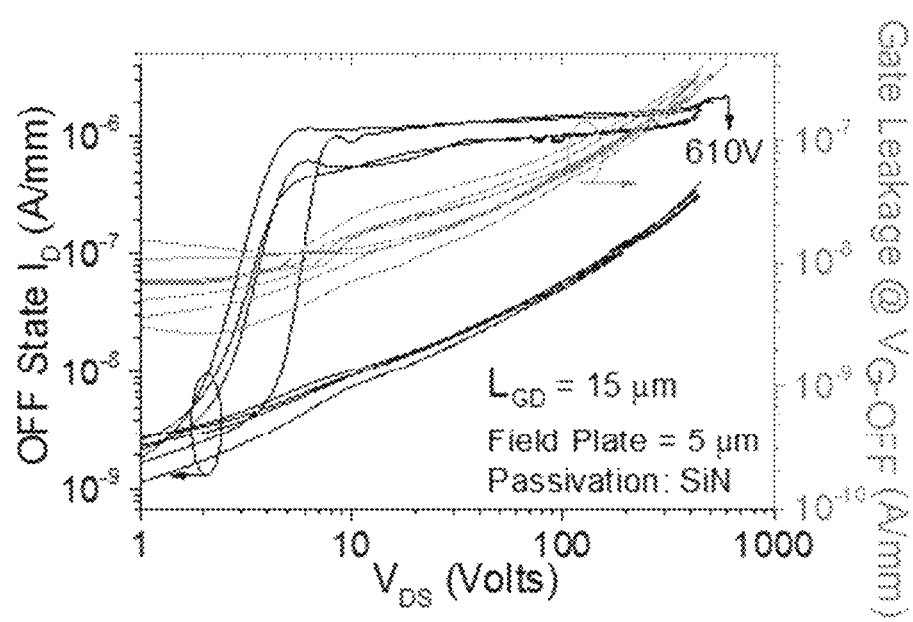
FIG. 17 illustrates OFF state three terminal breakdown characteristic of the proposed device.

FIG. 17 depicts three terminal breakdown voltage (substrate grounded) >600V; sub-nA source-drain leakage and OFF-state gate leakage under high drain stress conditions highlight the usability of these devices.

Figure 18:
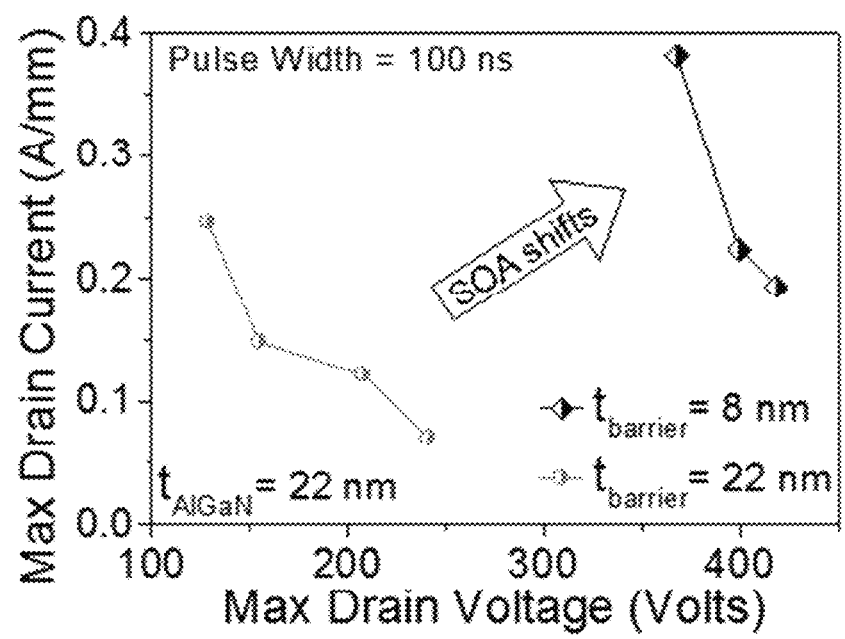
FIG. 18 illustrates increased SOA boundary observed for HEMTs with thinner AlGaN barrier under gate.

FIG. 18 illustrates an improved safe operating area (SOA) reliability due to reducing the AlGaN barrier thickness under the gate stack.

Figure 19:
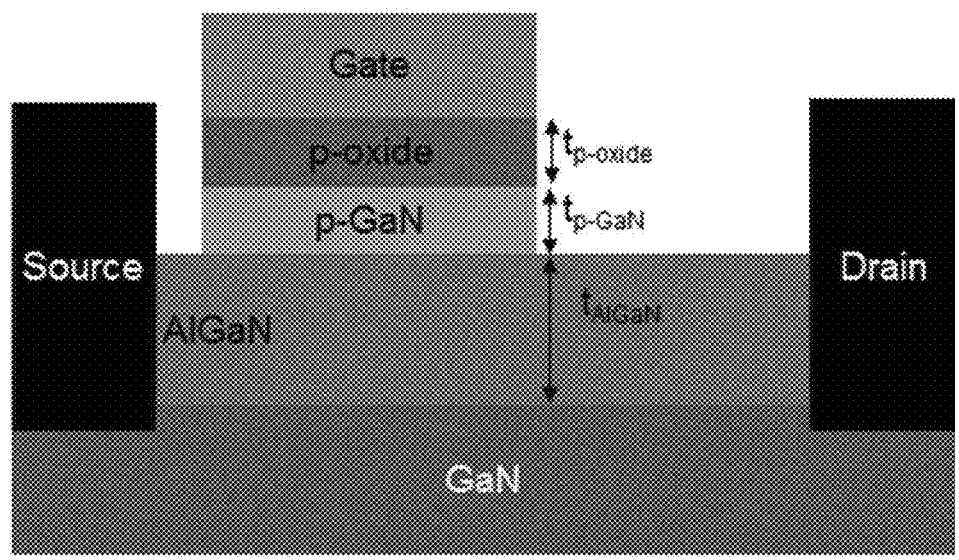
FIG. 19 illustrates a cross-sectional view of an HEMT with a hybrid p-type oxide and p-GaN based gate stack.

FIG. 19 illustrates an HEMT architecture with a hybrid gate stack comprising the proposed p-type oxide and p-GaN, in an exemplary embodiment of the present disclosure. In an embodiment, the hybrid gate stack offers a means to lower p-GaN doping while maintaining e-mode operation using the proposed Al—Ti—O based gate engineering.

Figure 20A:
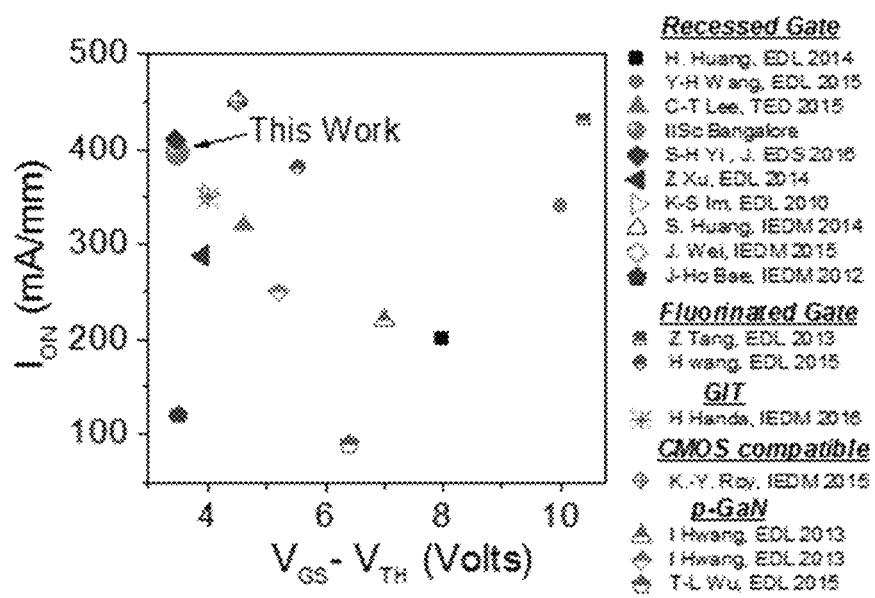
FIG. 20A illustrates state of the art of AlGaN/GaN e-mode HEMTs reported ON-state performance, compared for various techniques to achieve the e-mode operation.
Figure 20B:
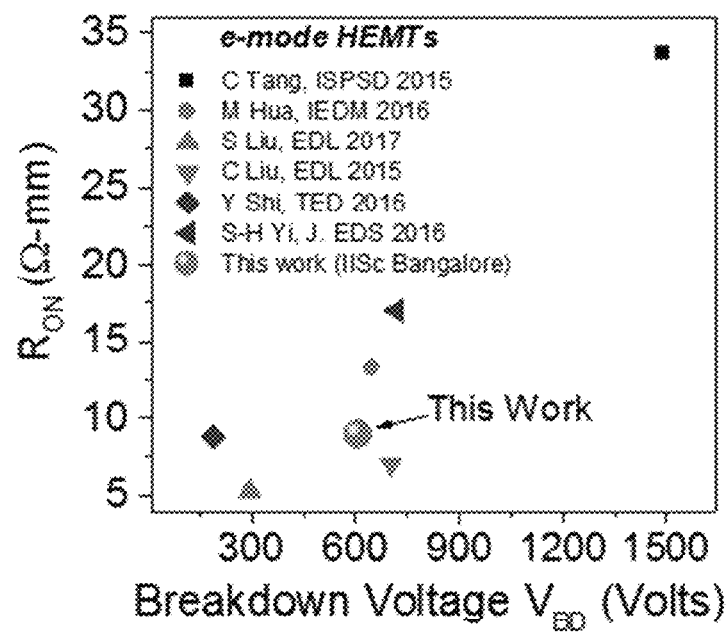
FIG. 20B illustrates $R_{ON}$-$V_{BD}$ performance of the proposed e-mode devices, compared to the reported works till date.

FIG. 20A illustrates the state-of-the-art AlGaN/GaN e-mode HEMTs reported ON-state performance compared for various techniques to achieve e-mode operation. FIG. 20B illustrates $R_{ON}$-$V_{BD}$ performance of the proposed e-mode device when compared to other reported works. The three terminal breakdown voltage is measured for an OFF-state source-drain leakage of 1 μA/mm.

In summary, it can be seen that $Al_xTi_{1-x}O$ exhibits p-type behaviour, and when integrated in a HEMT gate stack, results in a positive threshold voltage shift where Al % can be used to tune the $V_{TH}$. The proposed oxide can be seen to have advantages over other p-type oxides such as CuO and $NiO_x$ in terms of gate leakage and variability. Using the proposed p-type oxide, e-mode HEMTs are demonstrated with a $V_{TH}$ of about 0.5V and very low hysteresis. It is also seen that a thinner barrier and high-k nature of AlTiO results in superior gate control over channel and ON state performance.

While the foregoing describes various embodiments of the invention, other and further embodiments of the invention may be devised without departing from the basic scope thereof. The scope of the invention is determined by the claims that follow. The invention is not limited to the described embodiments, versions or examples, which are included to enable a person having ordinary skill in the art to make and use the invention when combined with information and knowledge available to the person having ordinary skill in the art.

ADVANTAGES

The present disclosure provides a field effect transistor (FET) operating in enhancement mode (e-mode).

The present disclosure provides an FET with a tunable threshold voltage.

The present disclosure provides an FET with a gate oxide which emulates p-type behaviour.

We claim:
1. A transistor comprising:
a source;
a drain; and
a hybrid gate stack that comprises $Al_xTi_{1-x}O$ that is an oxide that demonstrates p-type behaviour, wherein said $Al_xTi_{1-x}O$ demonstrates p-type behaviour by positioning a conduction band above a fermi level in a channel region, that is used as a control parameter to deplete two dimensional electron gas (2DEG) in the channel; and
wherein said hybrid gate stack is supported by an AlGaN/GaN stack, and wherein the hybrid gate stack is brought closer to a channel by partial removal of an AlGaN barrier under said hybrid gate stack, followed by deposition of said $Al_xTi_{1-x}O$.

2. The transistor as claimed in 1, wherein said $Al_xTi_{1-x}O$ is formed by Al doping of $TiO_2$ so as to impact said p-type behaviour to said oxide.

3. The transistor as claimed in claim 1, wherein said transistor is a High Electron Mobility Transistor (HEMT).

4. The transistor as claimed in claim 1, wherein Al content in said oxide is a controlling parameter for a threshold voltage.

5. The transistor as claimed in claim 1, wherein the hybrid gate stack further comprises a p-type GaN cap.

6. The transistor as claimed in claim 1, wherein said transistor is operated in an enhancement mode.

7. A transistor comprising:
a source;
a drain; and
a hybrid gate stack that comprises one or more p-type metal oxides, wherein the one or more p-type metal oxides demonstrate p-type behaviour by positioning a conduction band above a fermi level in a channel region; and
wherein the hybrid gate stack is supported by an AlGaN/GaN stack, and wherein the hybrid gate stack is brought closer to a channel by partial removal of an AlGaN barrier under said hybrid gate stack, followed by deposition of said p-type metal oxide.

8. The transistor as claimed in claim 7, wherein the hybrid gate stack further comprises a p-type GaN cap.

9. The transistor as claimed in claim 7, wherein the hybrid gate stack further comprises an insulator or dielectric material.

10. A method of making an $Al_xTi_{1-x}O$ based dielectric that demonstrates p-type behaviour, said method comprising the steps of using atomic layer deposition (ALD) to enable deposition of $Al_2O_3$ and $TiO_2$ across a plurality of cycles to introduce Al atoms in $TiO_2$, wherein said $Al_xTi_{1-x}O$ demonstrates p-type behaviour by positioning a conduction band above a fermi level in a channel region, that is use as a control parameter to deplete two dimensional electron gas (2DEG) in the channel; and
wherein the $Al_xTi_{1-x}O$ based dielectric is associated with a high electron mobility transistor.

11. The method of claim 10, wherein the method further comprises the step of depositing $Al_2O_3$ in an ALD chamber using cycles involving introduction of trimethylaluminium (TMA) and $H_2O$ precursors.

12. The method of claim 10, wherein the method further comprises the step of depositing $TiO_2$ in said ALD chamber using cycles involving introduction of Titanium tetraisopropoxide (TTIP) and $H_2O$ precursors.

* * * * *